United States Patent
Liu et al.

(10) Patent No.: US 9,726,547 B2
(45) Date of Patent: Aug. 8, 2017

(54) MICROBOLOMETER DEVICES IN CMOS AND BICMOS TECHNOLOGIES

(71) Applicant: INTERNATIONAL BUSINESS MACHINES CORPORATION, Armonk, NY (US)

(72) Inventors: Qizhi Liu, Lexington, MA (US); Anthony K. Stamper, Williston, VT (US); Ronald F. Waller, Grand Isle, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 67 days.

(21) Appl. No.: 14/553,203

(22) Filed: Nov. 25, 2014

(65) Prior Publication Data

US 2016/0146672 A1 May 26, 2016

(51) Int. Cl.
*G01J 5/20* (2006.01)
*H01J 37/317* (2006.01)
*H01L 37/00* (2006.01)

(52) U.S. Cl.
CPC ............ *G01J 5/20* (2013.01); *H01J 37/3171* (2013.01); *H01L 37/00* (2013.01); *H01J 2237/31701* (2013.01)

(58) Field of Classification Search
CPC .. G01J 5/02; G01J 5/20; H01J 37/3171; H01J 37/00
See application file for complete search history.

(56) References Cited

U.S. PATENT DOCUMENTS

| | | |
|---|---|---|
| 4,472,239 A | 9/1984 | Johnson et al. |
| 5,450,053 A | 9/1995 | Wood |
| 6,359,276 B1 | 3/2002 | Tu |
| 7,489,024 B2 | 2/2009 | Socher et al. |
| 7,884,328 B2 | 2/2011 | Cho et al. |
| 8,080,797 B2 | 12/2011 | Vogt et al. |
| 8,110,883 B2 | 2/2012 | Ward et al. |
| 8,395,229 B2 | 3/2013 | Garcia-Blanco et al. |
| 2006/0063292 A1 | 3/2006 | Landsberger |
| 2007/0272864 A1 | 11/2007 | Li et al. |
| 2011/0248374 A1 | 10/2011 | Akin et al. |
| 2013/0187169 A1* | 7/2013 | Taylor ............... H01L 21/28506 257/76 |

(Continued)

OTHER PUBLICATIONS

Liddiard, "The Active Microbolometer: a New Concept in Infrared Detection", Proceedings SPIE, vol. 5274, Mar. 30, 2004, Abstract.

(Continued)

*Primary Examiner* — David Porta
*Assistant Examiner* — Mindy Vu
(74) *Attorney, Agent, or Firm* — David Cain; Andrew M. Calderon; Roberts Mlotkowski Safran Cole & Calderon, P.C.

(57) ABSTRACT

A microbolometer device integrated with CMOS and BiCMOS technologies and methods of manufacture are disclosed. The method includes forming a microbolometer unit cell, comprises damaging a portion of a substrate to form a damaged region. The method further includes forming infrared (IR) absorbing material on the damaged region. The method further includes isolating the IR absorbing material by forming a cavity underneath the IR absorbing material.

20 Claims, 6 Drawing Sheets

(56) References Cited

U.S. PATENT DOCUMENTS

| | | | | |
|---|---|---|---|---|
| 2013/0248712 A1* | 9/2013 | Abdolvand | ............ | G01J 5/022 250/338.1 |
| 2014/0103210 A1* | 4/2014 | Feyh | ................. | G01J 5/024 250/338.4 |
| 2014/0248735 A1* | 9/2014 | Purkl | ................. | G01J 5/045 438/64 |
| 2016/0079306 A1* | 3/2016 | Kropelnicki | ............ | H01L 27/16 257/467 |

OTHER PUBLICATIONS

Niklaus et al., "MEMS-Based Uncooled Infrared Bolometer Arrays—A Review", Proc. of SPIE vol. 6836, 2007, 13 pages.

\* cited by examiner

MICROBOLOMETER DEVICES IN CMOS AND BICMOS TECHNOLOGIES

FIELD OF THE INVENTION

The invention relates to semiconductor structures and, more particularly, to a microbolometer device integrated with CMOS and BiCMOS technologies and methods of manufacture.

BACKGROUND

A microbolometer is a type of bolometer used as a detector in a thermal camera. Infrared radiation strikes the detector material, heating it, and thus changing its electrical resistance. This resistance change is measured and processed into temperatures which can be used to create an image. Unlike other types of infrared detecting equipment, microbolometers do not require cooling.

Microbolometers can be passive or active devices. For example, a passive microbolometer will have a temperature sensitive resistor. An active microbolometer, on the other hand, will have a temperature sensitive transistor. In either scenario, the microbolometer requires a read-out circuit.

SUMMARY

In an aspect of the invention, a method of forming a microbolometer unit cell, comprises damaging a portion of a substrate to form a damaged region. The method further comprises forming infrared (IR) absorbing material on the damaged region. The method further comprises isolating the IR absorbing material by forming a cavity underneath the IR absorbing material.

In an aspect of the invention, a method comprises: depositing a sacrificial material over the IR absorbing material; forming a patterned IR absorbing material on the damaged region; forming vias through the patterned IR absorbing material and into the substrate; forming a cavity in the substrate through vias, under the IR absorbing material; and electrically connecting a wire to the IR absorbing material.

In an aspect of the invention, a structure comprises: a substrate having a damaged region; a microbolometer of a patterned IR absorbing material provided on the damage region; and a cavity formed in the substrate under the damaged region.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to microbolometer devices and methods of manufacture. More specifically, the present invention integrates microbolometer devices with CMOS and BiCMOS technologies. In this way, advantageously, there is no need for any additional Readout Integrated Circuit (ROIC). Also, by integrating the microbolometer devices with CMOS and BiCMOS technologies, both active and passive device performance can be significantly improved.

In embodiments, the structures and methods of the present invention can use a Si "membrane" or "bridge" to serve as a core for IR (infrared) detecting (absorbing) materials of the microbolometer device, integrated with CMOS technologies. Also, in embodiments, a thermal isolation is provided from the Si substrate by an air gap, e.g., cavity, and from neighboring devices. In embodiments, the IR detecting (absorbing) materials can either sandwich a Si layer or can be provided beneath a Si channel.

The microbolometer devices of the present invention can be manufactured in a number of ways using a number of different tools. In general, though, the methodologies and tools are used to form structures with dimensions in the micrometer and nanometer scale. The methodologies, i.e., technologies, employed to manufacture the microbolometer device of the present invention have been adopted from integrated circuit (IC) technology. For example, the structures of the present invention are built on wafers and are realized in films of material patterned by photolithographic processes on the top of a wafer. In particular, the fabrication of the microbolometer device of the present invention uses three basic building blocks: (i) deposition of thin films of material on a substrate, (ii) applying a patterned mask on top of the films by photolithographic imaging, and (iii) etching the films selectively to the mask.

Figure 1:
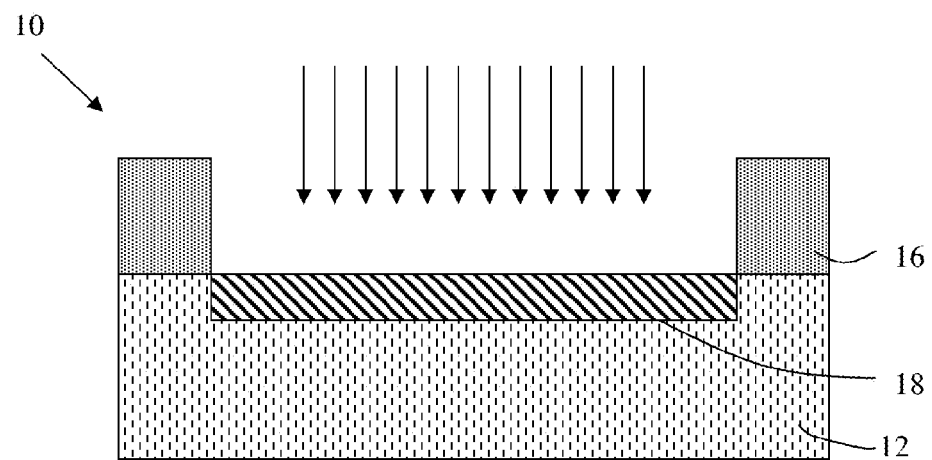
FIGS. 1-6 show respective fabrication processes and respective structures in accordance with aspects of the present invention.

FIG. 1 shows a structure and respective fabrication processes in accordance with aspects of the present invention. Specifically, FIG. 1 shows a structure 10 comprising a substrate 12. In embodiments, the substrate 12 is Si; although other semiconductor materials are also contemplated by the present invention. Although not shown in FIG. 1, semiconductor or passive technologies, not limited to CMOS, BiCMOS, and Bipolar technologies can already be formed on the substrate. The active devices can be optionally isolated from the IR absorbing material (microbolometer) by, e.g., a deep trench filled with insulating material on sides of the microbolometer unit cell or by an airgap.

In the process flow, a resist 16 is formed on the layer 12, and exposed to energy (light) to form a pattern (opening). The resist 16 will protect CMOS technologies, e.g., FETs, etc., during subsequent implantation processes. For example, an implant process is performed through the opening of the resist to amorphize (damage) the substrate 12 to form an implanted region 18 (e.g., damaged region).

In embodiments, the implant process can be, for example, one or more of argon, neon, silicon, germanium, or boron implant. For example, the argon implant can be provided at a dosage of 1e13 cm$^3$ to 1e16 cm$^3$; although other dosages are also contemplated by the present invention. For example, in an alternative embodiment, the implanted region 18 can be a heavily B-doped region of, e.g., >1e19 cm$^3$. The implanted region 18 will be used to create a Si bridge in a subsequently formed IR absorbing region in the implanted region 18. After the implant process, the resist 16 is stripped using conventional processes. For example, the resist can be removed by an oxygen ashing process, by way of one illustration.

In alternative embodiments, the implanted region 18 can be representative of a SiGe base layer, rather than the implant damaged Si layer. Much like the implant damaged Si layer, the SiGe base layer can be used as the etch stop layer for cavity/membrane/bridge formation. In this embodiment, in a BiCMOS technology, for example, the SiGe base layer is grown on top of Si substrate using any known method such as ultra high vacuum chemical vapor deposition (UHVCVD) and the SiGe layer is used as an etch stop layer for the undercut etch as noted below. Accordingly, no implant is needed.

Figure 2:
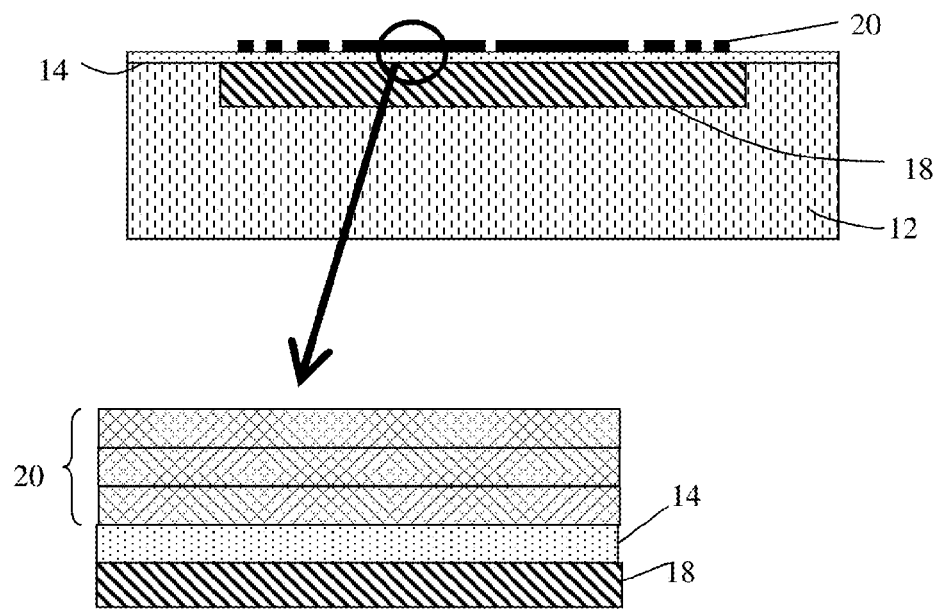

In FIG. 2, an oxide layer 14 (e.g., $SiO_2$) can optionally be deposited on the substrate 12 using known deposition methods, e.g., chemical vapor deposition (CVD), thermal oxidization, etc. A patterned layer of any IR absorber material, as known in the art, is formed on the layer 14. By way of examples, the IR absorber can be a combination of SiN/$VO_2$/SiN or N/$VO_2$/N. Additional IR absorbing materials contemplated by the present invention include, e.g., amorphous silicon ($\alpha$-Si), amorphous silicon germanium ($\alpha$-SiGe), Ti, Poly SiGe, BiLaSrMnO, YBaCuO, GeSiO, etc.

In embodiments, the IR absorbing material 20 can be formed by either an additive or subtractive process, as should be understood by those of ordinary skill in the art. For example, an IR absorber material(s) can be blanket deposited on the substrate 12 and preferably over the implanted region 18 using a conventional chemical vapor deposition (CVD) or physical vapor deposition (PVD) process. After deposition, a resist can be formed on the IR absorber material(s) and patterned by exposure to energy (light). The patterning will result in openings which provide a window for etching processes, e.g., removal of exposed material. In embodiments, the etching can be a reactive ion etching (RIE), ion milling, or wet chemical etching used with the appropriate etchants to remove the exposed material. After the etching, if the resist is not being used during the subsequent cavity formation, any remaining resist material can then be removed by an oxygen or hydrogen ashing process or other stripping processes known to those of skill in the art. In embodiments, any layout and geometry of the IR absorbing material into pre-determined unit cells, e.g., IR absorbing elements, is contemplated by the present invention.

Figure 3:
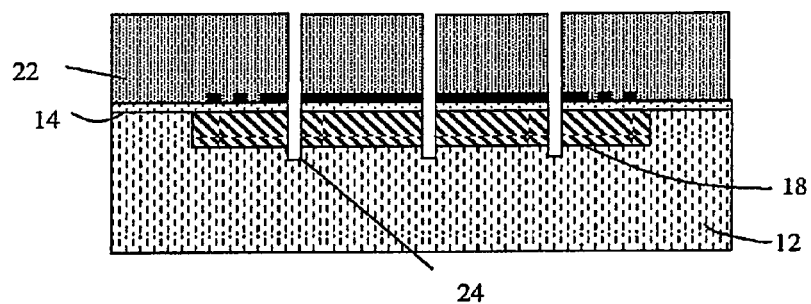

As shown in FIG. 3, vent vias 24 are formed through the IR absorber material 20, implanted region 18 and into the underlying substrate 12. For example, an array of vent vias 24 can formed using a resist pattern 22, with conventional lithography and etching processes as described herein.

Figure 4:
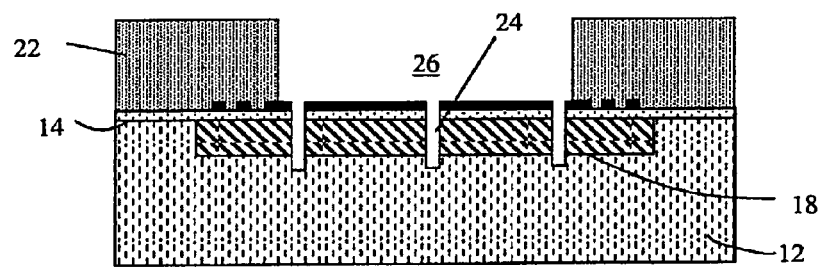

In FIG. 4, a larger opening or pattern 26 is formed in the resist 22, again using conventional lithography processes as described herein. The openings in layer 20 act as self-aligned openings to form vent vias 24 to the underlying substrate 12. Layers 18 and 12 are etched selectively to layer 20 to form trenches in the substrate.

Figure 5:
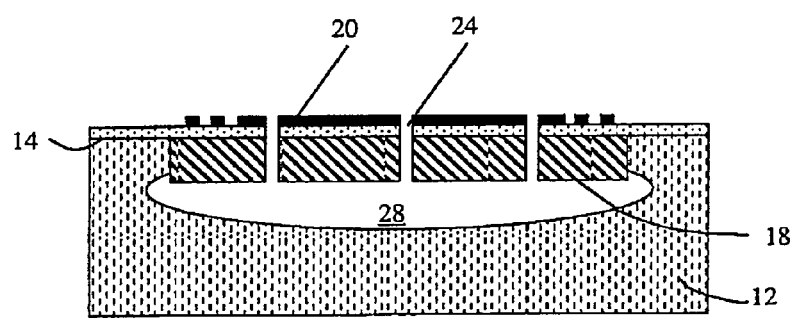
Figure 6:
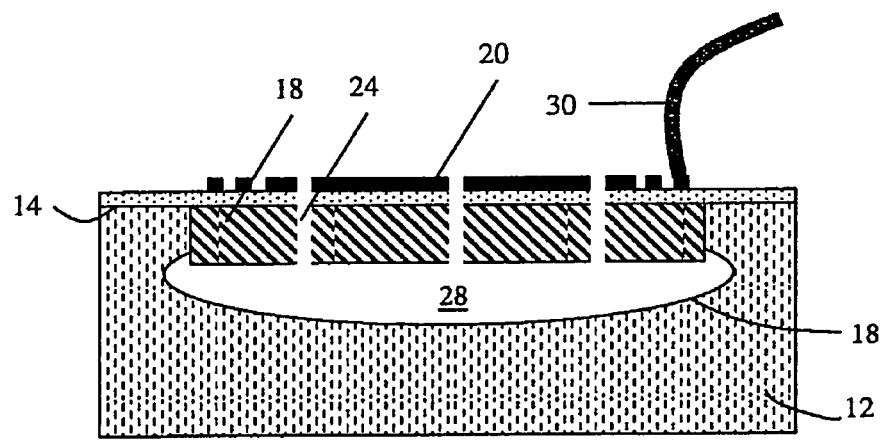

In FIG. 5, a cavity 28 is formed under the implanted region 18 through the vent vias 24. For the embodiment shown in FIG. 3, the resist optionally provides protection for all underlying oxide or other dielectric material. For the embodiment shown in FIG. 4, the resist provides protection only in areas away from the implanted region 18. In embodiments, the cavity 28 is formed by an undercut etch performed through the vent vias 24. The undercut etch can be, for example, a KOH wet chemical etch performed in the substrate 12 under the implanted region 18. As an optional process, the implanted region 18 can undergo an annealing process to form a single crystalline structure after the cavity formation and resist removal. The resist can then be removed using conventional stripping processes, e.g., oxygen ashing processes. In FIG. 6, connections to the package such as wirebonds 30 can be attached to the IR absorber material 20, using any known bonding or packaging methods.

Figure 7:
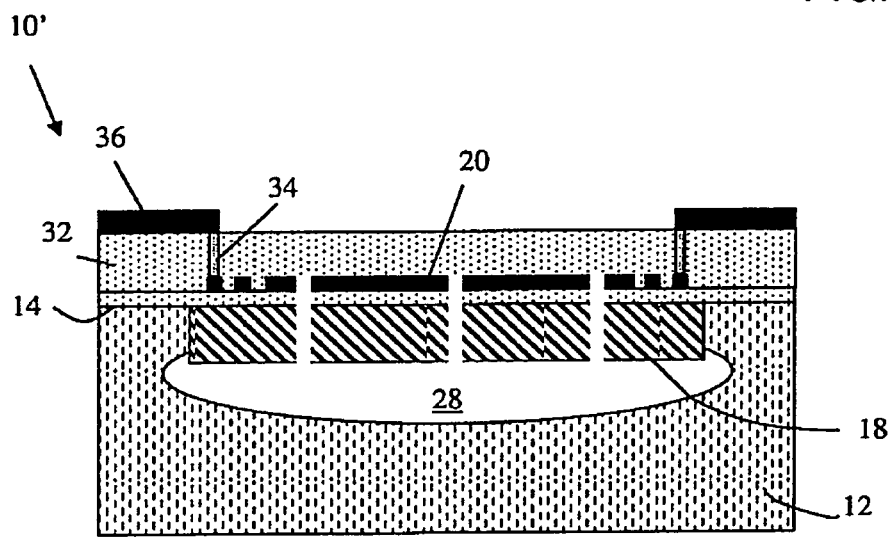
FIGS. 7 and 8 show respective fabrication processes and respective structures in accordance with additional aspects of the present invention.
Figure 8:
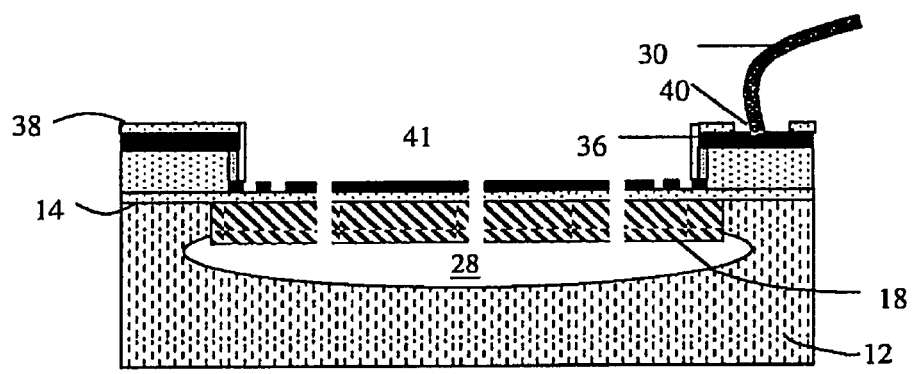

FIGS. 7 and 8 show an alternative structure 10' and respective processing steps in accordance with aspects of the invention. As shown in FIG. 7, a dielectric layer 32 is formed over the IR absorber material 20, which is optionally planarized and then patterned and etched in a conventional manner to form a via structure, e.g., interconnect 34. The via is filled with a metal material as known in the art, e.g., refractory metal lined copper or tungsten, using conventional deposition processes. For example, the via can first be lined with a metal or metal alloy, e.g., tantalum nitride, titanium nitride, etc., using a plasma vapor deposition (PVD) process; although other deposition processes are also contemplated by the present invention such as atomic layer deposition (ALD) or CVD processes. A metal material, such as copper or tungsten, can then be deposited within the via using an electroplating process. The structure can then undergo a planarization process, e.g., chemical mechanical polishing (CMP) to remove excess metal from the surface, as known in the art. Thereafter, a wiring layer 36 is formed in electrical connection with the interconnect 34. In embodiments, the wiring layer 36 can be formed using conventional deposition and patterning processes of aluminum, copper, etc. using either damascene or subtractive etch processes as known in the art. In embodiments, multiple levels of wires and vias are formed.

In FIG. 8, a dielectric layer 38 is formed over the wiring layer 36, which is patterned and etched in a conventional manner to form an opening 40 and optionally opening 41 over the cavity. Wirebonds or other packaging contacts 30 can be attached to the wiring layer 36, using any known bonding methods.

Figure 9:
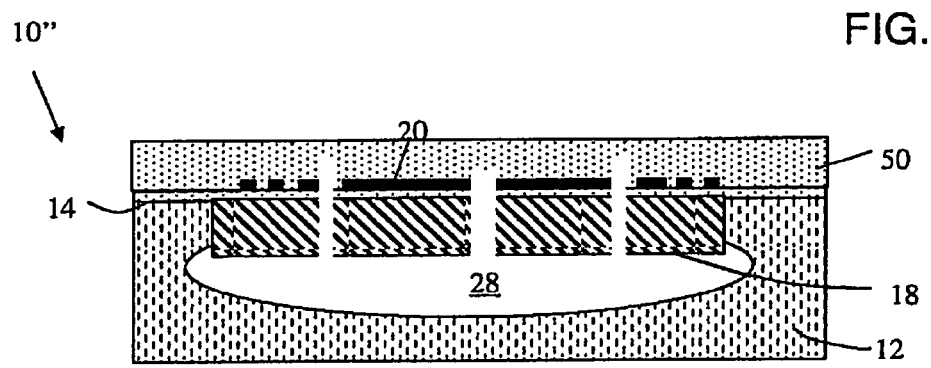
FIGS. 9-11 show respective fabrication processes and respective structures in accordance with additional aspects of the present invention.
Figure 10:
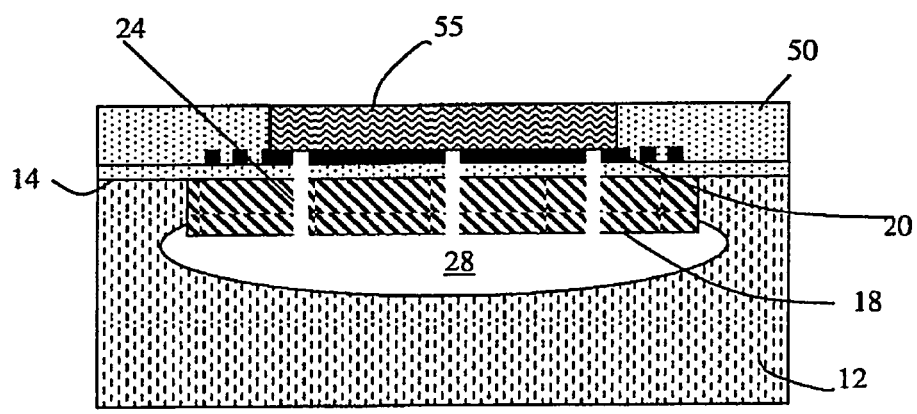
Figure 11:
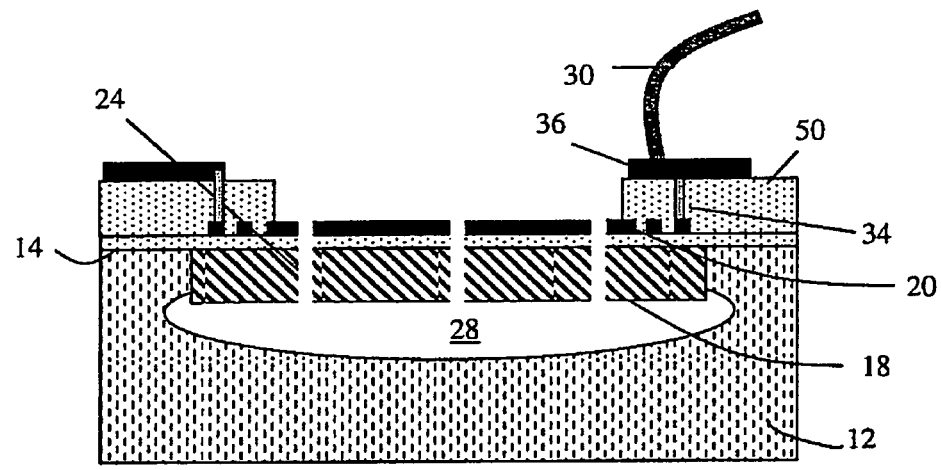

FIGS. 9-11 show respective fabrication processes and respective structures in accordance with additional aspects of the present invention. Prior to forming the structure shown in FIG. 9, the steps described in FIG. 1-5 are performed, leaving the wafer with a cavity formed under what will eventually become the bolometer. In FIG. 9, the structure 10" includes depositing dielectric layer 50 using any known method, such as CVD, and planarizing the dielectric layer 50 using, for example, chemical mechanical polishing (CMP). The layer 50 may be composed of silicon dioxide.

In FIG. 10, an opening is patterned and etched, followed by an optional thin (10-100 nm) dielectric deposition such as silicon dioxide, followed by filling the opening with a sacrificial material such as silicon, followed by planarization as known in the art, as represented by reference numeral 55.

As shown in FIG. 11, the dielectric layer 50 can then be patterned and etched in a conventional manner to form a via and wire structures similar to that shown and described with regard to FIGS. 7 and 8. Finally, the sacrificial material 55 is removed, leaving an opening over the bolometer. If silicon is used for the sacrificial material 55, then $XeF_2$ gas can be used to remove the silicon, as known in the art.

Figure 12:
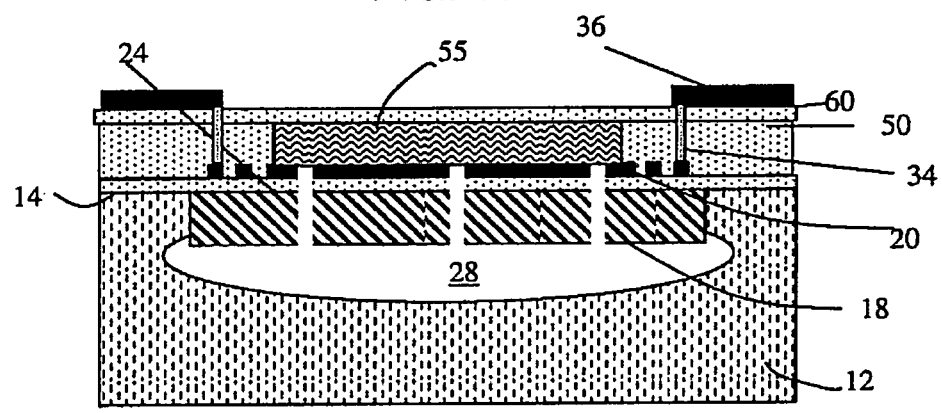
FIGS. 12-14 show respective fabrication processes and respective structures in accordance with additional aspects of the present invention.
Figure 13:
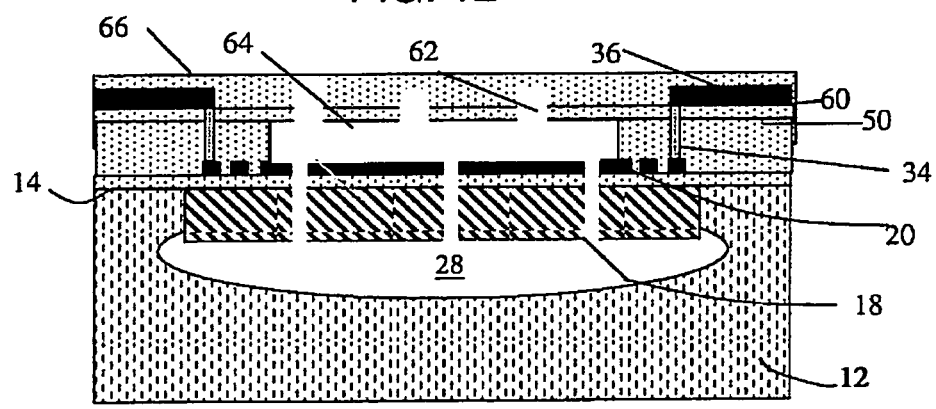
Figure 14:
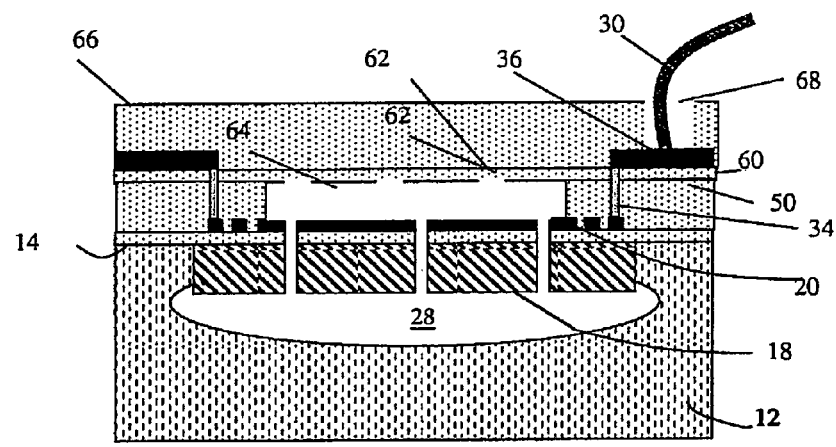

FIGS. 12-14 show an alternative embodiment. For this embodiment, the wafer is processed as shown in FIG. 10 but, in this embodiment, dielectric lid layer 60 is deposited.

Layer 60 can include any dielectric, such as CVD silicon dioxide, and is deposited to such a thickness to preclude the oxide shattering or cracking during the subsequent removal of sacrificial layer 55, as known in the art. FIG. 12 shows the wafer after additional formation of vias and wires, similar to that shown in FIG. 7.

FIG. 13 shows the wafer after lithographically pattering photoresist, etching dielectric lid layer 60, stripping the photoresist, cleaning the wafer, and venting or removing the sacrificial material 55 through vent holes 62, to form a cavity 64, and the deposition of the final passivation dielectric layer 66. Dielectric layer 66 also will seal the vent holes 62 so that the cavity is hermetically sealed, as known in the art. If silicon is used to form the sacrificial layer 55, then $XeF_2$ gas can be used to remove the silicon. If silicon is used for layer 55, then any method, such as plasma enhanced CVD (PECVD), CVD, or physical vapor deposition (PVD) can be used to deposit it on the wafer. Finally, FIG. 14 shows the completed wafer, with bond pad openings and wirebonds or other packaging contacts, formed similar to the ones in FIG. 11.

Figure 15:
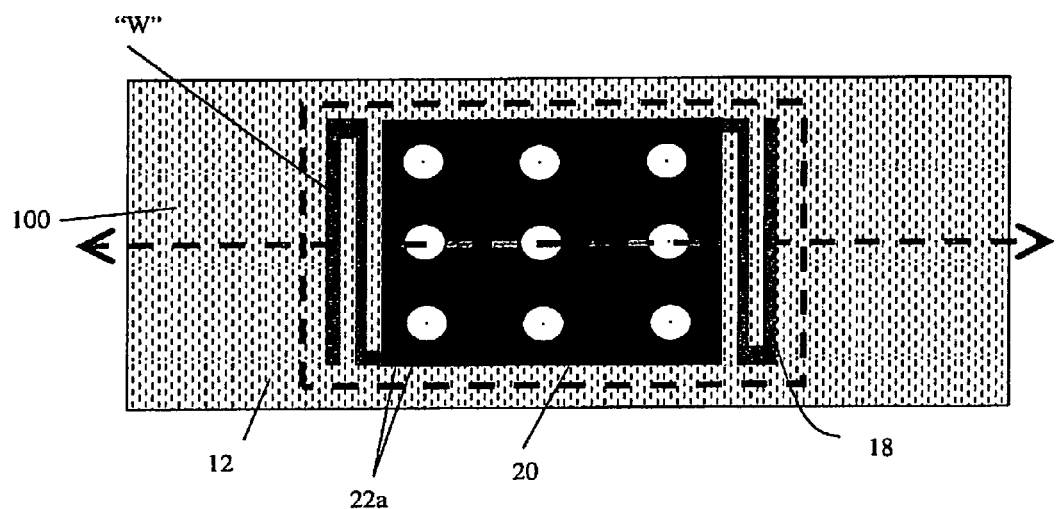
FIG. 15 shows a top view of a structure in accordance with additional aspects of the present invention.

FIG. 15 shows a top view of the structure of the present invention. As shown, the IR absorbing elements 20 (e.g., microbolometer) can be integrated with CMOS technologies 100 on a same substrate 12. Also, the IR absorbing elements 20 can be formed in a bridge structure 22a. The wiring "W" can be cladded with a low resistance conductor, such as aluminum, NiCr, copper, gold, etc. The microbolometer pixels can be exposed to ambient or a dielectric lid can be present over the pixel, as described in the previous figures. If a dielectric lid is employed, then it is desirable that it be transparent or nearly transparent to the infrared light wavelengths that the bolometer is exposed to.

These CMOS technologies 100, e.g., FETs, etc., can be formed prior to the processes described herein, such that the microbolometer device of the present invention can be integrated with the CMOS technologies. These FETs form read-out circuits/elements for each microbolometer unit cell. It should also be recognized that the dashed regions in substrate 12 are shallow trench isolation (STI) to surround the IR unit cell. In embodiments, the CMOS could be on the peripheral of each IR unit cell. In this way, the present invention provides an integrated microbolometer in CMOS technology with a Si "membrane" or "bridge" sandwiching a core of IR-absorbing elements 20. The IR absorbing materials 20, e.g., $VO_2$, etc., are integrated with Readout Integrated Circuit (ROIC) 100 on the same chip. The present invention also provides thermal isolation from the Si substrate 12 by the cavity and from neighboring devices. Also, both passive devices, e.g., IR-absorbing layers sandwiching Si and active devices, e.g., IR-absorbing layer beneath Si channel, are possible with the present invention.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a microbolometer unit cell, comprising:
   damaging a portion of a substrate to form a damaged region of the substrate;
   forming infrared (IR) absorbing material on the damaged region; and
   isolating the IR absorbing material by forming a cavity underneath the IR absorbing material.

2. The method of claim 1, wherein the damaged region comprises an ion implantation process.

3. The method of claim 2, wherein the IR absorbing material is isolated from active devices, which are protected during the ion implantation process.

4. The method of claim 1, wherein forming the cavity comprises forming a plurality of vent holes through the IR absorbing material and damaged region and removing portions of the substrate underneath the damaged region.

5. The method of claim 1, further comprising forming an electrical connection to the IR absorbing material.

6. The method of claim 5, wherein the forming of the electrical connection is a wirebonding process.

7. The method of claim 5, wherein the forming of the electrical connection comprises forming a via structure and wiring layer in electrical contact with the IR absorbing material.

8. The method of claim 7, further comprising forming a wirebond to the wiring layer.

9. The method of claim 8, further comprising annealing the damaged region to form a single crystalline structure.

10. The method of claim 9, further comprising forming a cavity above the IR absorbing material, the forming of the cavity above the IR absorbing material comprises:
    depositing a sacrificial material over the IR absorbing material;
    forming a layer of material over the sacrificial material;
    forming venting holes in the layer of material;
    venting of the sacrificial material; and
    sealing of the venting holes, wherein
      the cavity above the IR absorbing material is in direct communication with the cavity underneath the IR absorbing material through vias in the IR absorbing material and the damaged region.

11. A method, comprising:
    providing a damage region in a substrate;
    forming a patterned IR absorbing material on the damaged region;
    forming vias through the patterned IR absorbing material and into the substrate;
    forming a cavity in the substrate through the vias, under the IR absorbing material; and electrically connecting a wire to the IR absorbing material.

12. The method of claim 11, wherein the forming the cavity comprises forming a plurality of vias through the IR absorbing material and into the substrate and etching portions of the substrate underneath the IR absorbing material.

13. The method of claim 11, wherein the forming the cavity further comprises extending the plurality of vias through the damaged region to the substrate and removing of the substrate under the damaged region.

14. The method of claim 11, further comprising annealing the damaged region to form a single crystalline structure.

15. The method of claim 11, wherein the damaged region comprises an ion implantation process.

16. The method of claim 11, wherein the electrically connecting the wire to the IR absorbing material comprises a wirebonding process.

17. The method of claim 16, wherein the electrically connecting comprises forming a via structure and wiring layer in electrical contact with the IR absorbing material.

18. The method of claim 11, further comprising forming a cavity above the IR absorbing material.

19. The method of claim 18, wherein the forming of the cavity above the IR absorbing material comprises:
depositing a sacrificial material over the IR absorbing material;
forming a layer of material over the sacrificial material;
forming venting holes in the layer of material;
venting of the sacrificial material; and
sealing of the venting holes.

20. A structure comprising:
a substrate having a damaged region;
a microbolometer of a patterned IR absorbing material provided on the damaged region; and
a cavity formed in the substrate under the damaged region.

* * * * *